US012787200B2

(12) United States Patent
Eck et al.

(10) Patent No.: US 12,787,200 B2
(45) Date of Patent: Nov. 3, 2026

(54) RADIO SENSOR MODULE AND MODULAR SYSTEM FOR FORMING A RADIO SENSOR MODULE

(71) Applicant: WIKA Alexander Wiegand SE & Co. KG, Klingenberg (DE)

(72) Inventors: Johannes Eck, Buergstadt (DE); Arno Klug, Elsenfeld (DE); Gabriel Bachmann, Elsenfeld (DE); Christian Muessig, Obernau (DE); Michael Heider, Aschaffenburg (DE); Christian Frohmader, Grossostheim (DE); Sebastian Gutsch, Miltenberg (DE); Thomas Eifert, Dorfprozelten (DE); Christian Wirl, Kleinheubach (DE); Lars Goettl, Elsenfeld (DE); Heiko Kern, Klingenberg (DE)

(73) Assignee: WIKA Alexander Wiegand SE & Co. KG, Klingenberg (DE)

( * ) Notice: Subject to any disclaimer, the term of this patent is extended or adjusted under 35 U.S.C. 154(b) by 528 days.

(21) Appl. No.: 18/124,105

(22) Filed: Mar. 21, 2023

(65) Prior Publication Data

US 2023/0225071 A1 Jul. 13, 2023

Related U.S. Application Data

(63) Continuation of application No. PCT/EP2021/070349, filed on Jul. 21, 2021.

(30) Foreign Application Priority Data

Sep. 21, 2020 (DE) ..................... 10 2020 124 535.1

(51) Int. Cl.
*H05K 7/14* (2006.01)
*G01D 7/00* (2006.01)
(Continued)

(52) U.S. Cl.
CPC ............ *H05K 7/1427* (2013.01); *G01D 7/00* (2013.01); *H05K 1/0243* (2013.01);
(Continued)

(58) Field of Classification Search
CPC ..... H01H 13/10; H01H 13/20; H04M 1/0249; H04M 1/236; H05K 7/1427;
(Continued)

(56) References Cited

U.S. PATENT DOCUMENTS

| | | | |
|---|---|---|---|
| 9,322,678 | B1 | 4/2016 | Stawitzky et al. |
| 2009/0272205 | A1 | 11/2009 | Brown et al. |

(Continued)

FOREIGN PATENT DOCUMENTS

| | | | |
|---|---|---|---|
| CN | 108414003 | A | 8/2018 |
| CN | 208606779 | U | 3/2019 |

(Continued)

OTHER PUBLICATIONS

European Office Action for Application 21754717.3 mailed on May 7, 2025.

(Continued)

*Primary Examiner* — Allen L Parker
*Assistant Examiner* — Dakota M Talbert
(74) *Attorney, Agent, or Firm* — Muncy, Geissler, Olds & Lowe, P.C.

(57) ABSTRACT

A radio sensor module having a sensor base module having at least one sensor circuit board that has a sensor, and/or having a terminal for connection to a sensor external to the radio sensor module; a process terminal and/or an extended sensor terminal; a housing portion that accommodates the sensor base module and the sensor circuit board; and a radio sensor unit having a structural carrier that carries therein a radio circuit board and an energy store that supplies the radio circuit board with electrical energy. The energy store has an (Continued)

electrical battery and an electrical condenser which are electrically connected in parallel. A modular system is also provided for forming such a radio sensor module.

29 Claims, 9 Drawing Sheets

(51) Int. Cl.
*H05K 1/02* (2006.01)
*H05K 5/00* (2025.01)

(52) U.S. Cl.
CPC . *H05K 5/0086* (2013.01); *H05K 2201/10098* (2013.01); *H05K 2201/10151* (2013.01)

(58) Field of Classification Search
CPC ...... H05K 1/0243; H05K 5/0086; G01D 7/00; G01D 21/00; G06F 21/566; G06F 1/16; G06F 30/39
See application file for complete search history.

(56) References Cited

U.S. PATENT DOCUMENTS

2012/0319866 A1* 12/2012 Svoen .................... H04Q 9/00 73/649
2015/0188023 A1* 7/2015 Pond .................... A61C 1/0015 310/317
2016/0104374 A1* 4/2016 Ypma .................... G07C 9/00182 340/5.25
2018/0017414 A1* 1/2018 Binder .................... G01D 9/005
2019/0145801 A1 5/2019 Sasaki

FOREIGN PATENT DOCUMENTS

| | | | |
|---|---|---|---|
| CN | 110793575 | A | 2/2020 |
| EP | 2466273 | A1 | 6/2012 |
| EP | 3486616 | A1 | 5/2019 |
| JP | H396810 | | 4/1991 |
| JP | 2011-520103 | A | 7/2011 |
| JP | 2017528702 | A | 9/2017 |
| JP | 2017-203775 | A | 11/2017 |
| JP | 201990761 | A | 6/2019 |
| WO | WO 2016020085 | A1 | 2/2016 |

OTHER PUBLICATIONS

International Search Report dated Jan. 13, 2022 in corresponding application PCT/EP2021/070349.
Smith, T.et al: "Using Supercapacitors to Improve Battery Performance" Power Electronics Specialists Conferencem vol. 1, Jun. 23, 2002, pp. 124-128, XP010596075.
Japanese Office Action for Application No. 2023-514962 mailed on May 8, 2024.

* cited by examiner

RADIO SENSOR MODULE AND MODULAR SYSTEM FOR FORMING A RADIO SENSOR MODULE

This nonprovisional application is a continuation of International Application No PCT/EP2021/070349, which was filed on Jul. 21, 2021, and which claims priority to German Patent Application No 10 2020 124 535.1, which was filed in Germany on Sep. 21, 2020, and which are both herein incorporated by reference.

BACKGROUND OF THE INVENTION

Field of the Invention

The invention relates to a radio sensor module and a modular system for forming a radio sensor module.

Description of the Background Art

Radio sensor modules for transmitting measured values are generally known from the prior art.

SUMMARY OF THE INVENTION

It is therefore an object of the invention is to provide a novel radio sensor module and a modular system for forming a radio sensor module.

According to the invention, the object is achieved by a radio sensor module and by a modular system.

The radio sensor module according to the invention is designed in particular for transmitting measurement data obtained from a measurement of pressure, temperature, flow, or level. The radio sensor module comprises a sensor base module having at least one sensor board comprising a sensor and/or or a connection for connection to a sensor external to the radio sensor module. Further, the radio sensor module includes a process port and/or an extended sensor port, a housing portion accommodating the sensor base module and the sensor board, and a radio sensor unit including a structure carrier. The structure carrier carries a radio board and an energy storage device supplying electrical energy in itself, the energy storage device comprising an electrical battery and an electrical capacitor. The battery and the capacitor are electrically connected in parallel.

The battery enables the radio sensor module to be supplied with energy in continuous operation. The capacitor connected in parallel is provided for buffering and takes over or supports the power supply in particular in the event of current peaks occurring and/or during inrush current phases of the radio sensor module. In particular, the capacitor also supports a voltage of the battery when the battery is put back into operation after a longer rest period and in this case initially starts with voltage dips when the cell chemistry is put into operation.

The battery can be a lithium cell, which may be lithium thionyl chloride based. Furthermore, the capacitor can be designed as a hybrid layer capacitor, which comprises electrodes and/or a cell structure based on lithium intercalation compounds. Such a structure enables the intercalation of atoms, ions or small molecules between crystal lattice planes of layer crystals. In this regard, a battery and capacitor so formed exhibit low internal resistance and can deliver high current pulses. As an alternative to a pure thionyl chloride ($SOCl_2$) structure, this can also be used in further optimized mixtures, such as sulfuryl chloride ($SO_2Cl_2$) in combination with thionyl chloride and lithium (Li).

For example, the lithium cell is characterized by having a mass fraction of 10% to 30% lithium cobalt nickel oxide and 10% to 20% graphite or carbon ($C_6$) and 15% to 50% of aforementioned lithium thionyl chloride. For example, an electrolyte of the lithium cell basically comprises a solution of lithium tetrachloroaluminate in thionyl chloride. Based on the electrochemical reaction, the thionyl chloride is also an active depolarizer. The electrolyte is therefore often referred to as the catholyte or liquid cathode. The cathode is made, for example, of highly porous acetylene carbon black with Teflon binder. Remaining components are nickel-plated steel contacts and a housing. Altogether, these components have a mass of, for example, 17 grams to 20 grams. For example, a rated power is 2.2 Ah to 3.0 Ah at a voltage of 3 volts to 4 volts. For example, an average continuous discharge current for the lithium cell is about 100 mA depending on the cycle, so combining it with the capacitor to buffer short current spikes is an optimal addition.

For example, a pulse current capability of the capacitor is up to 0.5 amps or 0.75 amps or 1 amp with a mass of only 3.0 grams to 5.0 grams designed. For example, a rated power is 0.05 Wh to 0.10 Wh at a voltage of 3 volts to 4 volts. Regarding the design, the type used for this purpose was a hybrid layer capacitor.

The intercalation connections can be spirally wound to improve a performance.

A capacity of the battery can be 5 Wh to 15 Wh and a capacity of the capacitor can be 90 Ws to 220 Ws. Such values have been found to be particularly suitable for use in the radio sensor module.

The capacitor can be electrically charged by the battery, in particular during normal operation, so that the capacitor is always charged for buffering.

The energy storage device and the radio board can be arranged in the radio sensor unit interleaved with respect to one another. This enables a compact arrangement of the energy storage and radio board.

An interlacing angle formed between an axial surface plane of the radio sensor unit and an axial surface plane of the energy storage device is greater than zero degrees, so that extensions of the axial surface planes cross outside. This enables a particularly compact arrangement of the energy storage device and the radio board.

The axial surface planes can extend at least substantially perpendicular to a central axis of the housing section, or the energy storage device and the radio board can be arranged relative to one another such that their axial surface planes run parallel.

The energy storage device and the radio board can be arranged off-center relative to a central axis of the radio sensor unit, or the energy storage device and the radio board are arranged in a central axis of the radio sensor unit. In this way, a better use of space can be achieved.

The radio circuit board can have an upper section and a lower section, wherein an antenna is mounted on the radio board in the upper section and a connector coupled to the energy storage device is arranged below the antenna. This enables a space-saving arrangement of the antenna and the connector, as well as easy coupling of the radio board.

The radio sensor unit can comprise a housing cap that is mechanically coupled to the structure carrier or to an intermediate ring arranged between the sensor base module and the radio sensor unit and, in particular, encloses the energy storage device and the radio board in a sealing manner and thus protects them from external influences.

An O-ring can be arranged between the housing cap and the structure carrier or between the housing cap and the intermediate ring, which provides a cost-effective and reliable seal.

The housing cap and the structure carrier or the housing cap and the intermediate ring can have locking elements for forming a bayonet lock. The bayonet lock provides a connection that is easy to make, stable, and also easy to release.

The housing cap can have an inner stop and/or an inner step, the energy storage device being axially fixed by the stop and/or the step. Alternatively, or additionally, the energy storage device is fixed or vibration-damped by at least one spring element. This enables simple and reliable storage and fixation of the energy storage device as well as protection of the same from shock.

The housing cap can be formed from plastic and is thus particularly light, available at low cost and does not impair radio communication.

The housing section accommodating the sensor base module and the sensor board can be made of stainless steel. This results in a high mechanical stability as well as a chemical resistance to process media and environmental influences.

The housing cap and the housing section are connected to each other via the structure carrier or intermediate ring and consequently in a particularly simple manner and without the need for additional components.

The structure carrier has integrally formed receptacles for the energy storage device and the radio board, the receptacles each being designed in particular as a guide section which encloses the energy storage device and the radio board in sections and/or supports them in U-shaped and/or circular sections. This enables the energy storage device and the radio board to be held in a simple and reliable manner without the need for additional holding elements.

The structure carrier can be designed as a universally applicable PCB holder, whereby an inner receptacle or shaft can be combined with different PCB geometries and/or different types of energy storage devices and can be closed from the outside with different housing caps, sealed and reopened in the event of a change of the energy storage device.

A metal-oxide semiconductor field effect transistor or a microcontroller can be provided, each of which is adapted to activate the sensor base module.

The sensor base module processes at least one measured value detected by the sensor in the activated state, and the metal-oxide semiconductor field-effect transistor or microcontroller are designed to deactivate the sensor base module after processing the measured value, in particular after a time of 50 ms to 500 ms, in particular 200 ms. Thus, an energy consumption of the radio sensor module can be reduced.

This makes it possible to wake up the sensor base module to request measured values via an interrupt or to switch it on for a certain time via a switching element. This is possible cyclically depending on the selection. The clock of a request for measured values can be set here externally by a user, in particular via a radio interface with an app on a mobile terminal device or via another interface, for example a universal radio sensor interface using a UART or $I^2C$ protocol.

The metal-oxide semiconductor field effect transistor and the microcontroller can be configured to maintain the sensor base module with the at least one sensor and/or with the connection for connecting to a sensor external to the radio sensor module in a standby mode, further reducing power consumption.

The metal-oxide-semiconductor field-effect transistor or microcontroller can activate the sensor base module with the at least one sensor and/or with the connection for connecting to a sensor external to the radio sensor module from the stand-by mode via an interrupt when a measured value is requested. Thus, the sensor base module can be operated for a maximized period of time in stand-by mode with low energy consumption and is only actively operated for a minimized period of time when a measured value acquisition and transmission is required. This enables particularly low-energy operation of the radio sensor module.

The sensor base module and the at least one corresponding sensor can have a power consumption of less than 1 μA in the standby mode.

The sensor can be a piezoelectric sensor, a thick-film ceramic sensor, a thin-film sensor, a thermal flow sensor, or an optical level sensor. Such sensors detect the corresponding measured value particularly reliably.

The radio board can comprise transmission units for data transmission using at least two different radio standards, the radio standards comprising, for example, Bluetooth and/or wireless HART and/or a proprietary transmission method based on a chirp spread spectrum modulation technique. Alternatively, or additionally, the radio board comprises at least one chip antenna. This enables data transmission to other devices, which may have different radio standards.

The radio board can be designed to be smaller, in particular shorter in a spatial extension direction, than a second possible radio board when it is designed for transmission in accordance with the Bluetooth standard or wireless HART.

The radio board can be designed for transmission according to the so-called Lora standard, in which case the radio board has larger dimensions and uses a printed circuit board antenna for transmission.

The radio board can be designed for transmission according to the so-called Lora standard and the Bluetooth standard. In this case, the radio board is longer than in the case of the sole design for transmission according to the Bluetooth standard. A holding geometry present here is characterized in particular by the fact that printed circuit boards are held in the same receptacle regardless of the length of the radio board, and both a printed antenna for transmission according to the Lora standard and a chip-internal antenna for transmission according to the Bluetooth standard are used.

In order to enable easy communication between the radio sensor module and the sensor itself and/or a sensor external to the radio sensor module, in a further possible embodiment of the radio sensor module the radio sensor unit comprises at least one communication interface which is designed for data transmission with the sensor and/or at least one sensor external to the radio sensor module.

The radio sensor unit can comprise an electrical module coupling section with electrical contacts and the sensor base module comprises an electrical module coupling section with electrical contacts. In this regard, the contacts enable transmission of sensor signals and transmission of power. Furthermore, a coupling direction of the electrical contacts of the module coupling sections of the radio sensor unit and the sensor base module is the same direction as a mounting direction of the radio board and the energy storage device of the radio sensor unit. Thus, the coupling of the electrical contacts can be performed in a simple manner during the assembly of the radio board and the energy storage device.

An opening of the process port or of the extended sensor port can be in the same direction as the coupling direction of the electrical module coupling sections, resulting in a simplified assembly of the radio sensor module and its components.

At least one of the module coupling sections can have a captive retaining ring, in particular attached to the radio sensor unit. The retaining ring enables the connection of the module coupling sections to be secured, and the captive arrangement enables the module coupling sections to be handled easily.

Both module coupling sections can comprise complementary locking elements for forming a bayonet lock for joint connection. The bayonet lock enables a connection between the radio sensor unit and the sensor base module that is easy to establish, stable and also easy to release.

Both module coupling sections can have complementary threads, in particular M12 threads, for forming a bayonet lock for joint connection, the threads enabling a particularly secure connection.

The electrical contacts of one of the module coupling sections can be formed as socket contacts and the electrical contacts of the other module coupling section are formed as pin contacts complementary to the socket contacts. This enables a simple, secure, robust and durable connection.

In this case, the module coupling sections can form, for example, a fixed coupling connector for the radio sensor unit and the sensor base module, so that no further fastening devices are required. For example, the coupling connector is designed in such a way that only electrical socket contacts are mounted on the radio sensor unit, while robust and durable pin contacts are mounted on the sensor base module. For example, the coupling connector has only 4 to 5 contacts.

The coupling connector can include a cable so that the radio sensor unit can be placed remotely from the sensor base unit at a location where improved transmit and receive conditions exist.

The process port can be configured to mechanically position and hold the radio sensor module to a complementary port alone. Thus, no additional positioning and holding means is required.

The radio sensor module can comprises a detection unit which is designed to detect a local approach of a mobile terminal device to a radio sensor via location data previously stored in a database by comparing an actual position of the mobile terminal device with the location data of the database. This results in the possibility of outputting a message via the mobile terminal device when it approaches the radio sensor module, for example when it falls below a local space and/or radius. Messages and measured values of the radio sensor can be triggered here both by the local approach, falling below a distance and by threshold values stored in the mobile terminal device and/or radio sensor module if these are exceeded during a measurement.

The approach can also be determined by satellite-based positioning systems using the mobile terminal device, whereby one or more positions of at least one radio sensor are initially determined during configuration and are stored by the associated mobile terminal device during configuration in a database for position evaluations for a radio sensor. In particular, all devices in an available radius can also perform a comparison to such a database on request, without each radio sensor having its own satellite-based position determination.

The radio sensor unit can be connected to a receiving station for evaluating and displaying measured values via a first connection protocol and to a user's mobile terminal device via a second connection protocol. The mobile terminal device includes, in particular, a position determination and a voice interface via which the user can also request measured values via voice and dictation services. When approaching the radio sensor unit, a message can be output here via an available device even if the local space and/or radius is not reached. For this purpose, communication to the mobile terminal device takes place via the second protocol, in particular via a mobile network, the Internet or via GSM services. The first protocol, on the other hand, can also be implemented as an https push service in the form of a so-called JSON file (JSON=JavaScript Object Notation), for example.

The sensor base module can form a lower sensor module and the radio sensor unit forms an upper sensor module. An EMC board is arranged between the radio board and the sensor board, wherein all electrical connections formed between the lower sensor module and the upper sensor module are routed via the EMC board. In this context, the terms "lower sensor module", "upper sensor module", "bottom" and "top" are used with reference to a usual intended use of the radio sensor module and with reference to the drawings shown, respectively. Of course, in a real application, "overhead" mounting or other mounting orientations of the radio sensor module may occur, in which case top and bottom may be different. In one possible embodiment, the term "bottom" is understood to mean a side of the radio sensor module on which a port for a process medium or an external connector is provided. In this case, the EMC board forms a coupling plane between the upper sensor module and the lower sensor module, respectively, in a simple manner. Furthermore, the EMC board combines all means for the control of the electromagnetic compatibility on one board, which can always be designed as a subordinate standard component, respectively.

All electrical connections between the sensor board, the radio board and the EMC board can be made via plug-in connectors permanently fixed to printed circuit boards of the sensor board, the radio board and the EMC board, and the EMC board forms a sealing section between the radio sensor unit and the sensor base module. The design of the plug-in connectors enables easy electrical connection of the sensor board, the radio board and the EMC board. The formation of the sealing section by the EMC board enables a simple sealing between the radio sensor unit and the sensor base module without additional sealing elements.

The connectors can be formed in at least one at least six-pin connector plug and a UART protocol or $I^2C$ protocol is provided as the internal data protocol. Such a design can be implemented simply and with little effort.

The EMC board can be connected in a sealed manner to a part of a housing of the lower sensor module or the structure carrier or the intermediate ring and/or the EMC board is guided in a sealed manner in the housing, the structure carrier or the intermediate ring. This embodiment allows a particularly simple realization of the sealing between the radio sensor unit and the sensor base module without additional sealing elements and a simple handling of all components during an assembly and disassembly of the radio sensor module.

The EMC board can be coupled to the module coupling section of the radio sensor unit for realizing a simple and reliable coupling and/or the EMC board is coupled to the sensor board by a plug-in connection.

The extended sensor connector can be configured to couple to a sensor external to the radio sensor module. In this case, a radio sensor module internal process port may be omitted.

Intelligent and/or configurable software can be provided which can control the timing of a transmission of sensor data as desired and/or requested by a control room, a router or an operator or as a function of a charge state of the energy storage device. At the same time, it is possible to store and execute specific operating patterns by teach-in or default or by selection from a library.

The modular system according to the invention for forming a previously mentioned radio sensor module can comprise a sensor base module with at least one sensor board comprising a sensor and/or a connection for connecting to a sensor external to the radio sensor module. The modular system further comprises a process port and/or an extended sensor port, a housing section that accommodates the sensor base module and the sensor board, and at least one radio sensor unit comprising a structure carrier. The structure carrier is designed to accommodate radio boards of different dimensions and energy storage devices of different dimensions provided for supplying them with electricity, and comprises fastening structures which are designed for damage-free assembly and disassembly of the radio board and the energy storage device. Furthermore, the modular system comprises a plurality of different radio boards and a plurality of energy storage devices with different dimensions, in particular each comprising an electric battery and an electric capacitor, which are electrically connected in parallel. In addition, the modular system comprises housing caps of different sizes, each of which can be mechanically coupled to a respective structure carrier, wherein the respective lengths of the housing caps, starting from a coupling structure for coupling to the structure carrier to an opposite end, correspond to the different dimensions of the energy storage devices and/or different dimensions of the different radio boards.

The modular system enables a modular structure of a radio sensor module, which allows different radio components, sensor cells or sensor elements to be coupled with different energy storage devices. The energy storage devices can be accommodated in different sizes by the structure carrier and a suitable housing cap without requiring structural changes.

Furthermore, the modular system allows the radio sensor unit to be connected via an interface either to a sensor internal to the radio sensor module, to a sensor external to the radio sensor module, or to an energy storage device.

Furthermore, the modular system allows different sensor base modules to be combined with different radio sensor units. Thus, on the one hand, a design of a lower sensor base module is possible, which has a pressure, temperature, flow or level sensor. On the other hand, a sensor base module can also be added to the radio sensor unit, which acts as a sensor signal processing module and can be coupled with a cable to another sensor external to the radio sensor unit via different protocols, for example with currents from 4 mA to 20 mA, so-called HART protocols, Profibus protocols or any other protocol.

This modular approach makes it possible to couple a wide variety of existing sensors with a wide variety of sensor technologies to the radio sensor unit.

This modularity is made possible in particular by a sensor interface between the radio sensor unit and the sensor base module or on the part of a sensor signal processing module, the sensor interface being independent of the measured variable.

In addition to the possibility of a scalable energy supply concept, which is realized by differently provided installation space for different energy storage devices with different lengths in an axis of a battery shaft or a battery receptacle, modularity with regard to the radio standards used is provided. Different radio boards can be used and connected with plug connectors, whereby the radio boards in particular each have the same circuit board geometries and connection options and in particular only differ in one axis, e.g. in their length.

Thus, by the modular system, it is possible for the first time to combine different energy storage devices with different radio boards and radio standards in a radio sensor unit on a platform basis, which in turn can be combined with a sensor base module of different type or measurement type or also with existing standard sensors.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
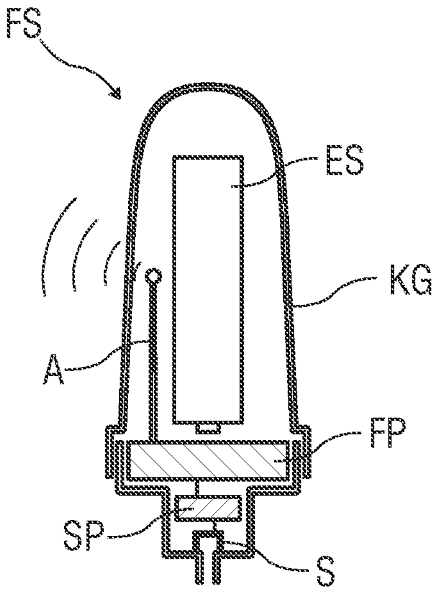
FIG 1 PRIOR ART
FIG. 1 schematically shows a radio sensor with integrated antenna according to the prior art, FIG. 2 schematically shows a radio sensor with attached antenna according to the prior art, FIG. 3A schematically shows a sectional view of a radio sensor module, FIG. 3B schematically shows a further sectional view of the radio sensor module according to FIG. 3A, FIG. 4A schematically shows a sectional view of a radio sensor module, FIG. 4B schematically shows a further sectional view of the radio sensor module according to FIG. 4A, FIG. 5 schematically shows a sectional view of a radio sensor module, FIG. 6A schematically shows a perspective view of a partially disassembled radio sensor module in a first configuration, FIG. 6B schematically shows a perspective view of a partially disassembled radio sensor module in a second configuration, FIG. 7 schematically shows an exploded view of a radio sensor module with differently configured lower sensor modules in section, FIG. 8 schematically shows a sectional view of a disassembled radio sensor module with a coupling connector for connecting an upper sensor module and a lower sensor module, FIG. 9A schematically shows a radio sensor module in an application environment, and FIG. 9B schematically shows a radio sensor module in another application environment.

FIG. 1 shows a possible embodiment of a prior art radio sensor FS.

The radio sensor FS comprises an integrated antenna A coupled to a radio board FP and a sensor S to which a sensor board SP is assigned. The antenna A is here integrated in a housing cap KG as a component.

The sensor board SP can transmit sensor data via the antenna A and takes electrical energy for this purpose from a single-cell energy storage device ES, for example an accumulator or a battery. In addition to transmission, the sensor board SP is designed for evaluation and processing of sensor data acquired by the sensor S.

Figure 2:
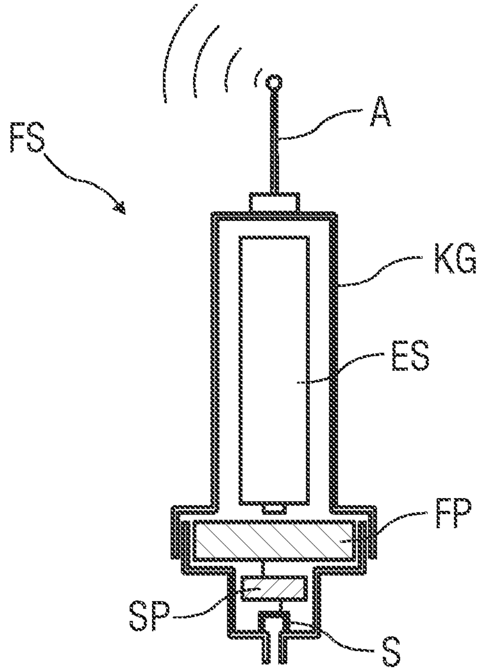
PRIOR ART FIG 2

FIG. 2 shows another possible embodiment of a prior art radio sensor FS.

In contrast to the example shown in FIG. 1, the antenna A is mounted on the outside of the housing cap KG.

Figure 3A:
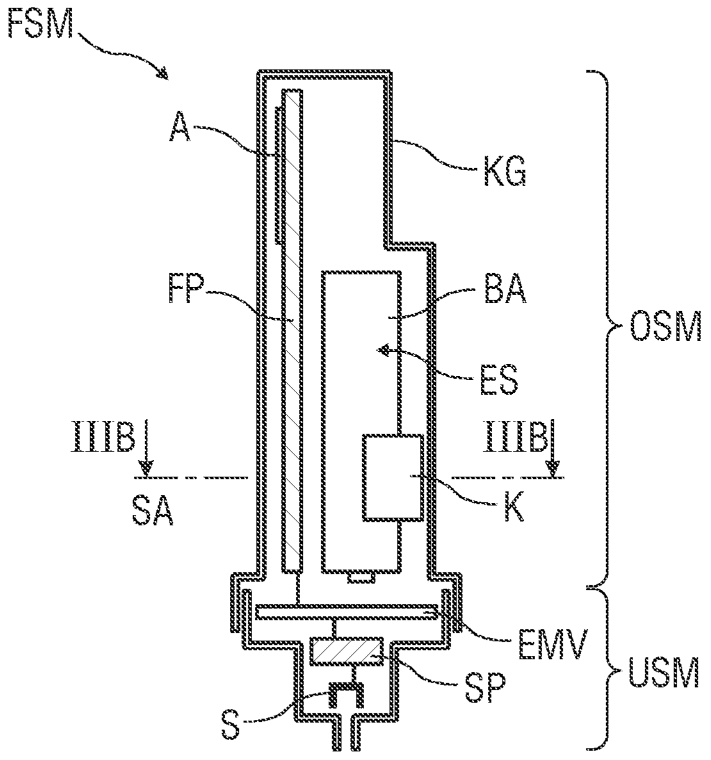

FIG. 3A shows a sectional view of a possible embodiment of a radio sensor module FSM according to the invention.

The radio sensor module FSM comprises an upper sensor module OSM and a lower sensor module USM coupled to it.

In the illustrated embodiment example, a sensor S designed as a pressure or temperature sensor is assigned to a sensor board SP, both of which are arranged in the lower sensor module USM.

The sensor board SP is connected to a radio board FP via an EMC board EMV and forms an interface between the upper sensor module OSM and the lower sensor module USM.

In the upper sensor module OSM, an antenna A designed as a radio antenna is arranged "onboard" on the radio board FP.

Figure 4A:
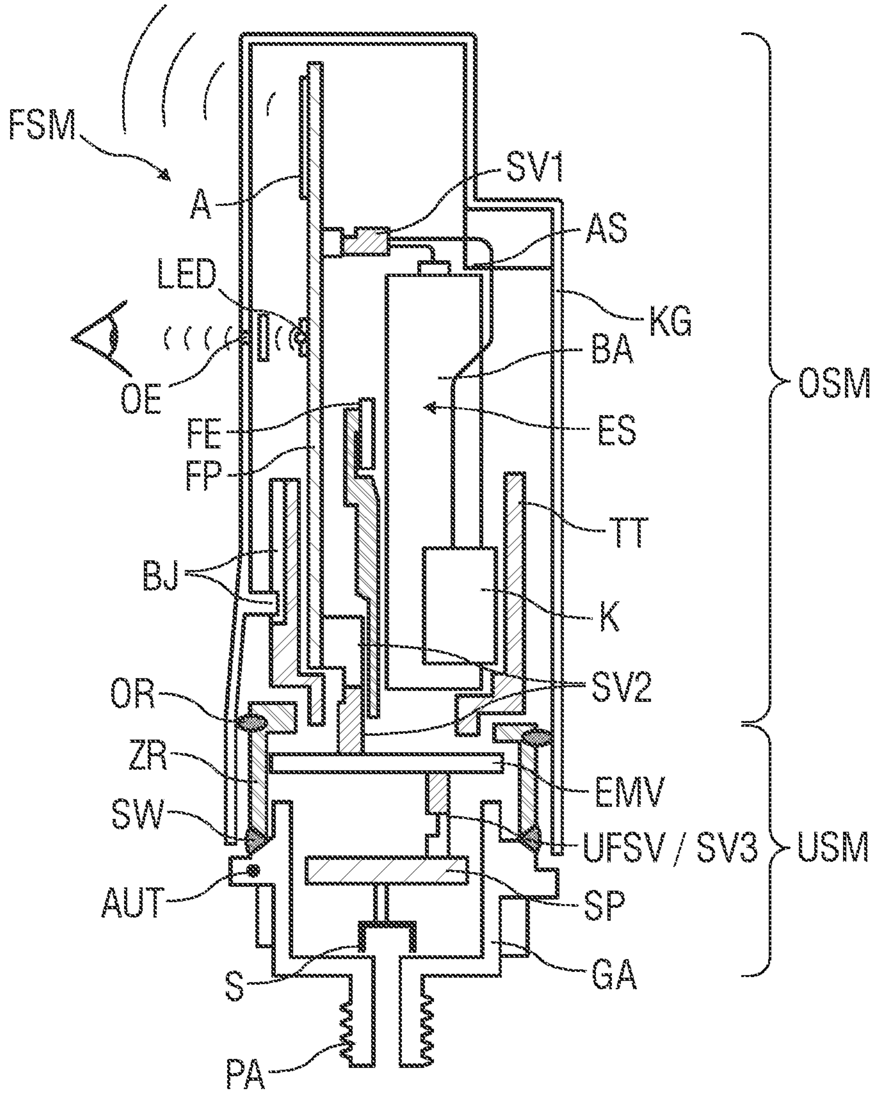

As shown in more detail in FIG. 4A, the radio board FP and the sensor board SP are coupled to an energy storage device ES for the power supply, the energy storage device ES comprising a battery BA in the form of an accumulator and a capacitor K. A housing cap KG sealingly encloses the energy storage device ES and the radio board FP, i.e. at least essentially the upper sensor module OSM.

Figure 3B:
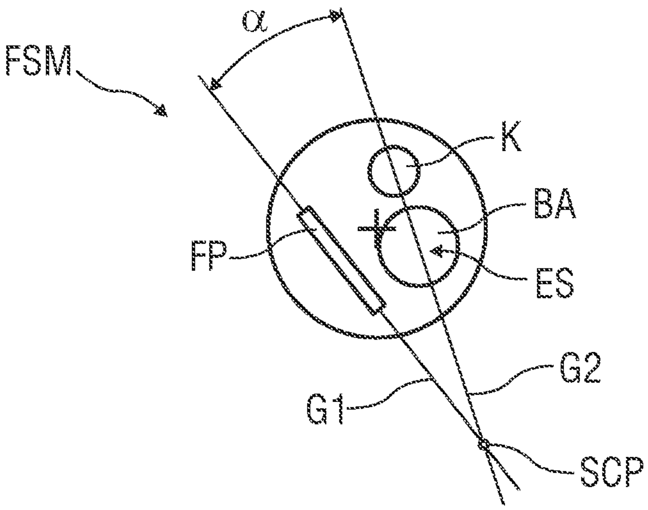

FIG. 3B shows a further sectional view of the radio sensor module FSM in a plane SA according to FIG. 3A, which illustrates an arrangement of the battery BA and the capacitor K in position to the radio board FP.

Both the battery BA and the capacitor K are accommodated within the upper sensor module OSM in a radio sensor unit and are held in a predetermined orientation relative to each other by a structure carrier TT or carrier part shown in more detail in FIG. 4A. The structural carrier TT is designed to accommodate one or different radio boards FP, i.e. radio printed circuit boards.

To form a compact arrangement, an axis G1 of a circuit board plane of the radio circuit board FP is interleaved with an axis G2 of a middle plane of the combined energy storage device ES, formed of battery BA and capacitor K, and at an intersection SCP of the two planes, these have in particular an angle $\alpha$ of 5° to 35° or 10° to 60° with respect to one another.

In particular, the battery BA and the capacitor K are electrically connected in parallel with one another. By designing the internal arrangement shown, different circuit board geometries and different battery types can be combined with each other, as described in more detail in the following embodiments.

FIG. 4A shows a sectional view of a further possible embodiment of a radio sensor module FSM according to the invention, in particular a more detailed principle view of the radio sensor module FSM according to FIGS. 3A and 3B.

Here, the radio sensor unit is arranged as an upper sensor module OSM on the lower sensor module USM.

Here, too, the sensor S is coupled and arranged in the lower sensor module USM with the sensor board SP for evaluation and amplification of the sensor data.

The sensor S is enclosed by the receiver base part AUT, which accommodates the sensor S and the sensor board SP, in particular in a sealed manner. The receiver base part AUT establishes a connection to the lower process port PA, to which a thread is formed.

Furthermore, the receiver base part AUT provides device connection surfaces GA on its outer side, at which a user can couple the receiver base part AUT to a process by a tool and, in particular, fasten it in a sealing manner.

For example, the receiver base part AUT is trough-shaped and comprises the process port PA, as shown in the embodiment. The process port PA is welded or formed onto the transducer lower part AUT. In embodiments not shown in more detail, the process port is not a component of the transducer lower part AUT.

The upper sensor module OSM comprises a structure carrier TT or a carrier part, which accommodates the energy storage device comprising the battery BA and the capacitor K as well as the radio board FP with the integrated antenna A.

The battery BA and the capacitor K are coupled to the radio board FP via a connector SV1 and supply electrical energy to all boards of the upper sensor module OSM on demand.

A spring element FE fixes the battery BA and the capacitor K via an elastic preload in the structure carrier TT and dampens externally acting vibrations for the energy storage ES.

The radio board FP has the antenna A, which is designed as an integrated conductor track or as an "onboard" mounted component.

The radio board FP is coupled to the EMC board EMV via a second connector SV2, which forms an interface between the upper sensor module OSM and the lower sensor module USM.

The EMC board EMV is coupled to the sensor board SP via another connector SV3. The electrical connector SV3 transmits both sensor data and power, but is also designed with several pin contacts so that other lower sensor modules USM can be coupled.

In particular, this connector SV3 is designed in such a way that a universal radio transmission connection UFSV can be provided at this point.

An interface generated in this way is also characterized in particular by the fact that sensors S or sensor boards SP connected at this point are briefly switched on in time windows for individual polling of measured values. This can be done, for example, on request and control of the radio board FP by switching on an electric current via MOSFETs or via a start value. Hereby, a switching on and off of the lower sensor module USM can be realized according to predetermined times or clockings, which have been defined in a software or a memory or configured by a user, in particular by radio control via a mobile communication device.

This can be done, for example, via the Bluetooth radio standard by app, or it can also be done by remote access via another radio protocol, such as a so-called MIOTY or LORAWAN protocol. In this case, for example, an integrated light, such as a light-emitting diode LED, on the FP radio board provides the user with a current status. The light is visible, for example, via an opening OE in the housing cap KG.

The housing cap KG is guided to the structure carrier TT via a bayonet lock BJ and can thus be removed without tools. Furthermore, the housing cap KG has a stop AS on the inside for axial guidance and limitation of the energy storage device ES, whereby the stop AS can also be designed as a molded-on step on a plastic part.

The housing cap KG also seals via an O-ring OR to a centering intermediate ring ZR, which accommodates the EMC board EMV in a sealing manner and is attached in a sealing manner circumferentially to the receiver base part AUT by a welded joint SW.

Figure 4B:
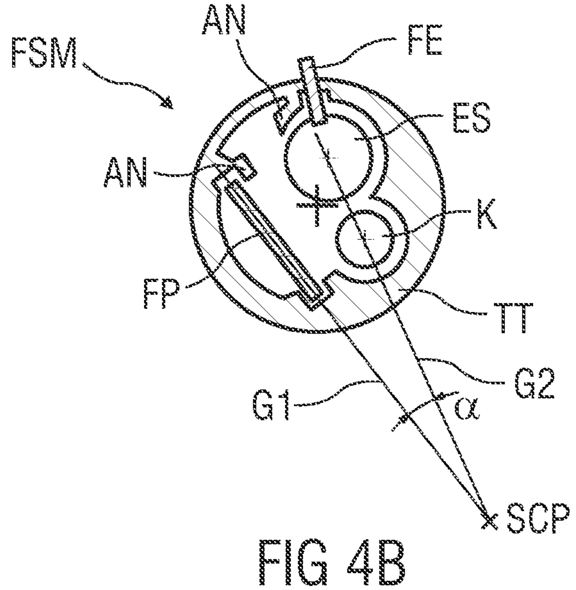

FIG. 4B shows another sectional view of the radio sensor module FSM, which illustrates the arrangement of the energy storage device ES in the structure carrier TT.

Essentially shown here is the structure carrier TT, which accommodates the battery BA, the capacitor K and the radio board FP. Both the battery BA and the radio board FP are exchangeably guided by molded-on guide ribs AN in the housing cap KG.

As shown in FIG. 3B, the axes G1, G2 of the printed circuit board plane of the radio board FP are interleaved with the middle plane of the combined energy storage device ES, formed of battery BA and capacitor K, for a more compact arrangement, and the intersection point SCP between the two planes or axes G1, G2 of the planes has, in particular, an angle α a [sic—delete a?] of 5° to 35° or 10° to 60°.

The intersection point SCP between the two planes lies in particular outside the housing cap KG. The battery BA and the capacitor K are connected in particular via an integrated circuit which automatically disconnects them from the radio board FP in the event of overtemperature or overload.

Figure 5:
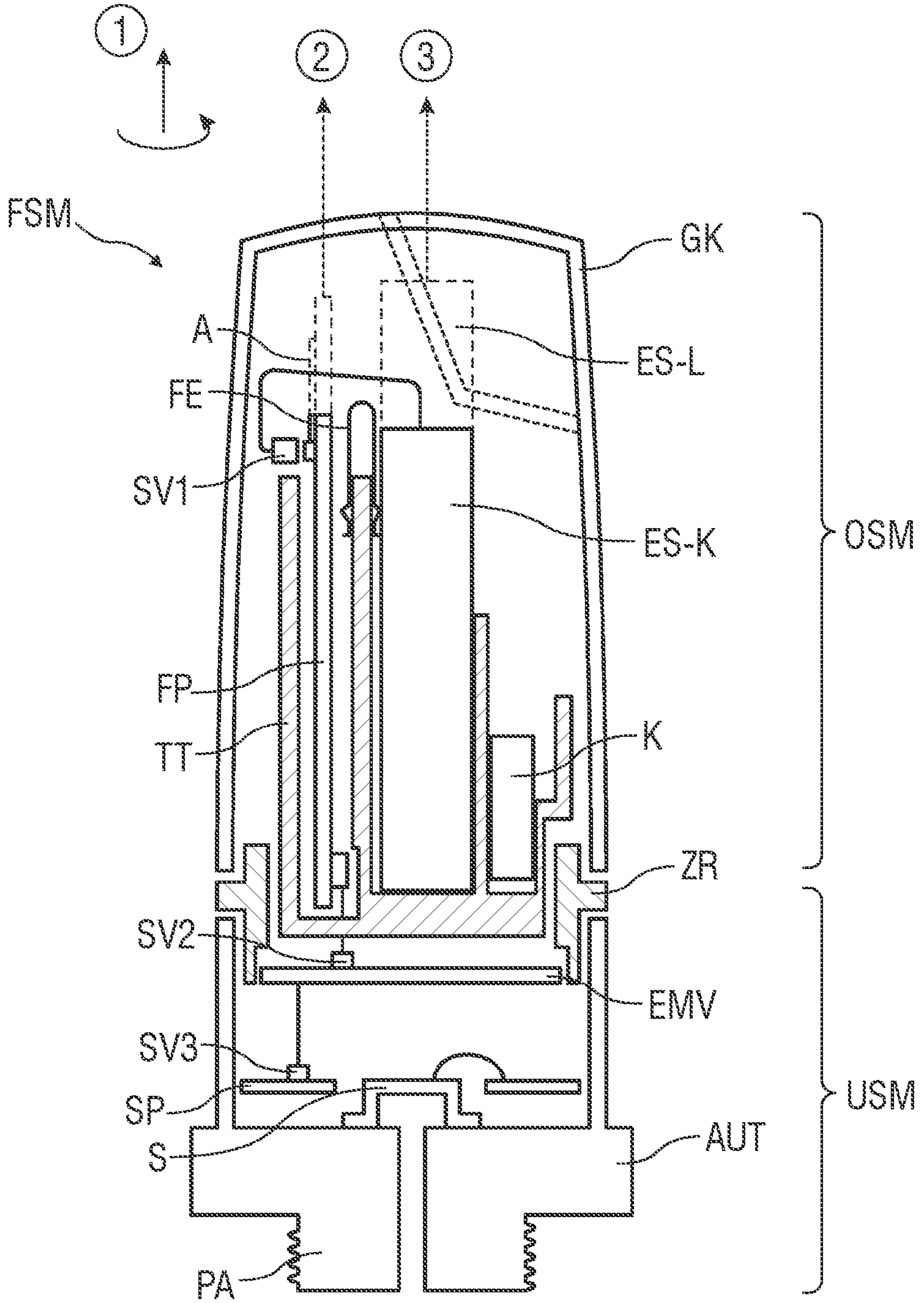

FIG. 5 shows a sectional view of another possible embodiment of a radio sensor module FSM according to the invention.

Here, too, the intermediate ring ZR accommodates the EMC board EMV as an interface between the lower sensor module USM and the upper sensor module OSM, the intermediate ring ZR being optionally permanently connected to the structure carrier TT or the receiver base part AUT.

The housing cap GK can be removed after rotation in direction (1). Hereafter, the radio board FP can be removed or exchanged from shafts of the structure carrier TT in direction (2) or a short energy storage ES-K can be removed or exchanged from shafts of the structure carrier TT in direction (3), i.e. vertically upwards. In this way, both a change of an energy storage device ES-K and a change of a radio board FP are possible.

Since different radio boards FP are possible, a radio standard or a transmission type can also be easily changed in this way. This is supported in particular by the vertical design of the second connector SV2, which is arranged on the EMC board EMV.

Here, too, the spring element FE fixes and/or supports the energy storage device ES in a vibration-damped manner inside the upper sensor module OSM, regardless of its length.

Dotted lines show a different equipment with a larger, i.e., in particular longer, energy storage device ES-L. Likewise, the use of a longer radio board FP with an antenna A is dashed and indicated as an option.

Depending on the design of the energy storage ES, ES K, ES-L, different housing caps GK can be mounted, which are characterized in particular by a different length, which differ in different heights in the direction of extension of the radio sensor module FSM, i.e., for example opposite to the process port PA.

In all other respects, the structure of the illustrated radio sensor module FSM corresponds in particular to the embodiment illustrated in FIGS. 4A and 4B.

Figure 6A:
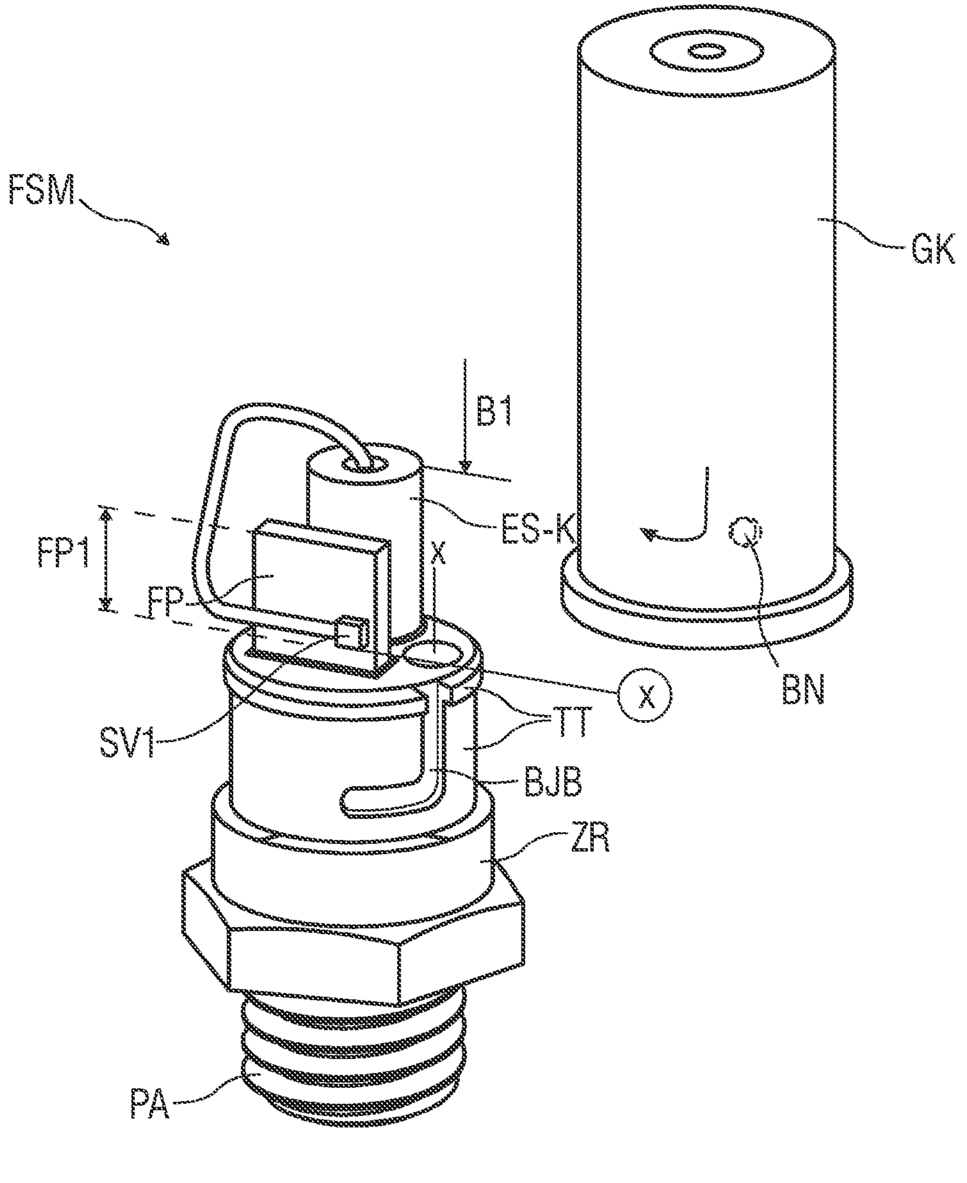

FIG. 6A shows a perspective view of another possible embodiment of a partially disassembled radio sensor module FSM according to the invention in a first configuration, i.e., in particular in a first equipment variant.

In this case, the structure carrier TT is equipped with a short, small energy storage device ES-K, which protrudes from the structure carrier TT with a headroom B1.

The radio board FP is arranged in a short version with a height FP1 protruding above the structure carrier TT, whereby the connector SV1 is oriented at a height (X) in the upper sensor module OSM to the structure carrier TT or to the intermediate ring ZR.

A bayonet path BJB is formed on the structure carrier TT, in which a knob BN of the housing cap KG engages when it is put on and can be locked by turning.

In all other respects, the structure of the illustrated radio sensor module FSM corresponds in particular to the embodiment illustrated in FIGS. 4A and 4B.

Figure 6B:
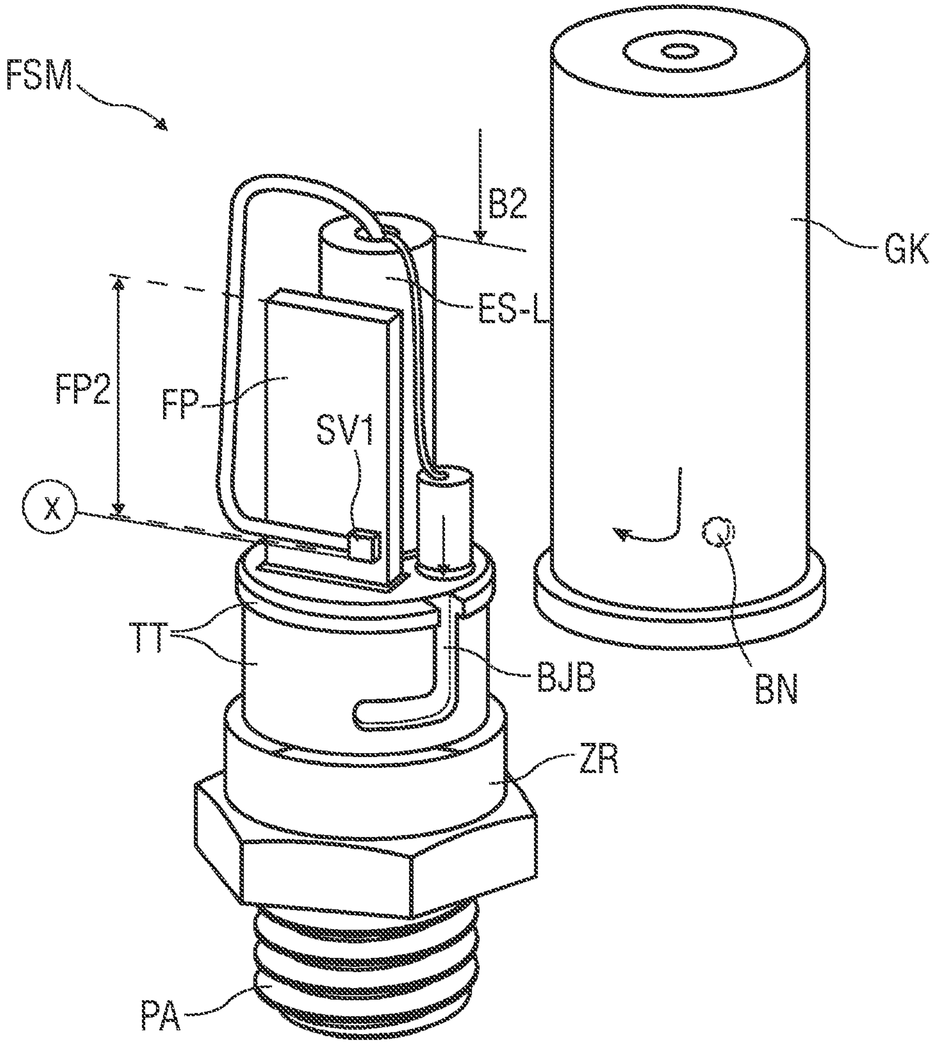

FIG. 6B shows a perspective view of a further possible embodiment of a partially dismantled radio sensor module FSM according to the invention in a second configuration, i.e., in particular in a second equipment variant.

Here, the structure carrier TT is equipped with a larger, long energy storage device ES-L, which protrudes from the structure carrier TT with a headroom B2. The headroom B2 is greater than the headroom B1 of the example of the radio sensor module FSM shown in FIG. 6A.

In a longer version, the radio board FP is designed with a height FP2 protruding above the structure carrier TT, whereby the connector SV1 is also oriented here as in the embodiment example shown in FIG. 6A at the same height (X) in the upper sensor module OSM to the structure carrier TT or to the intermediate ring ZR.

In all configurations, the connector SV1 to the energy storage ES, ES-K, ES-L is thus oriented in particular at the same height (X) to enable all combinations without cable extensions or cable shortening.

In all other respects, the structure of the radio sensor module FSM shown corresponds in particular to the embodiment example shown in FIGS. 4A and 4B.

Figure 7:
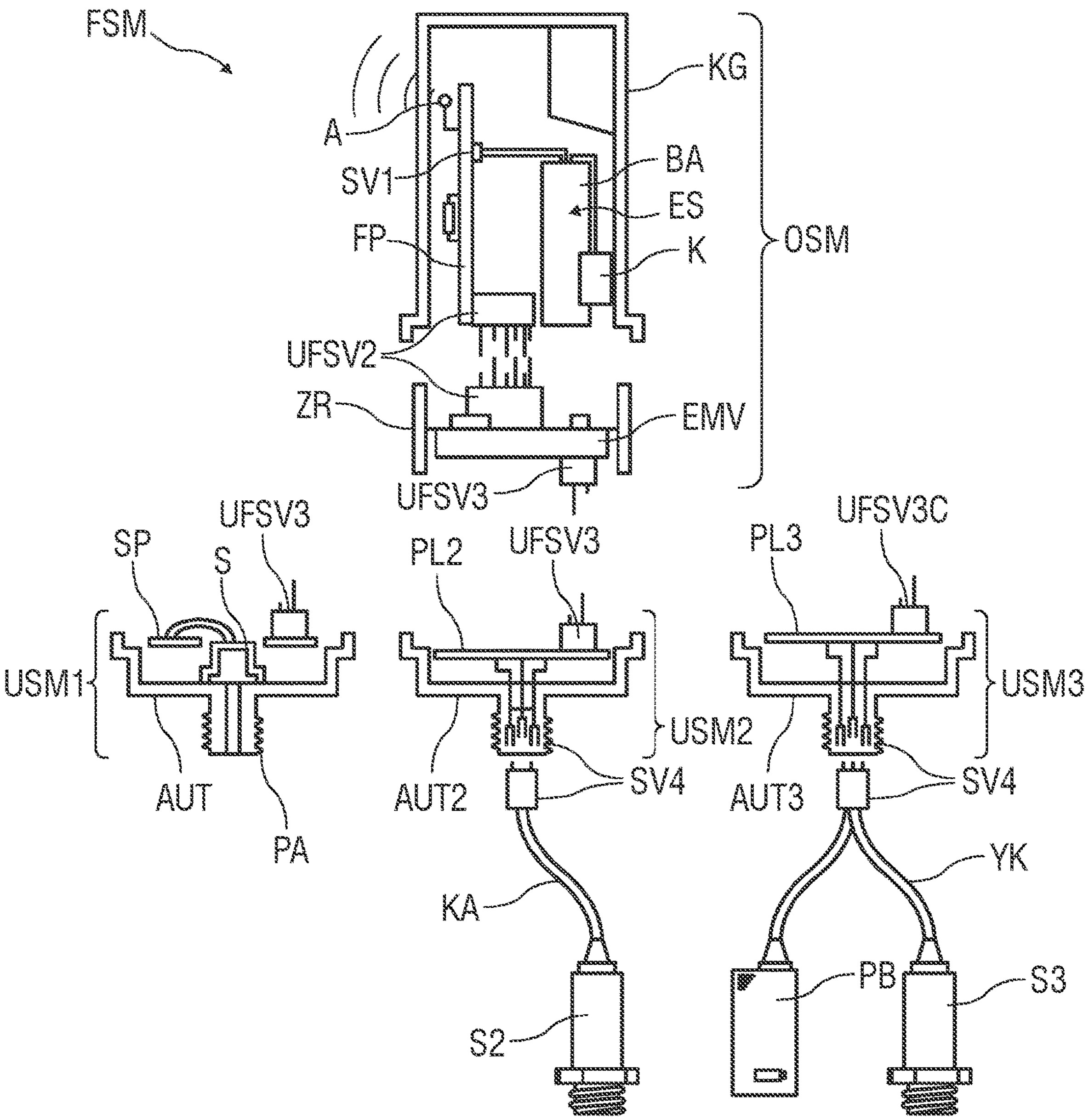

FIG. 7 shows an exploded view of a possible further embodiment of a radio sensor module FSM according to the invention with differently designed lower sensor modules USM in section as a platform view with possible couplings.

The upper sensor module OSM comprises the housing cap KG, which accommodates the radio board FP and the energy storage device ES.

The EMC board EMV is coupled to this via a universal radio transmission connection UFSV2 and is mounted in a sealing manner in the intermediate ring ZR. The intermediate ring ZR also seals off toward the housing cap KG.

As a termination of the upper sensor module OSM, the EMC board EMV has a universal radio transmission link UFSV3, via which several different lower sensor modules USM1, USM2, USM3 can be coupled and operated.

This includes, for example, the lower sensor module USM1 already shown in FIG. 5 with integrated sensor S, which is coupled to a process port PA and is arranged with an associated sensor board SP in the receiver base part AUT.

However, it is also possible to arrange another lower sensor module USM2 with a board PL2 in a receiver base part AUT2, wherein instead of a process port PA downward a connector SV4 is coupled to the board PL2. The connector SV4 provides an interface through which a conventional sensor S2 can be connected via a cable KA.

Here, the sensor S2 can be designed as a pressure sensor or other sensor, which is operable according to the 4 mA to 20 mA standard or the so-called HART or Profibus standard. Also, the sensor S2 can be addressable via another sensor protocol. Furthermore, the sensor S2 can be addressed via an interrupt or sequentially addressed and switched on via a MOSFET.

It is also possible to arrange another lower sensor module USM3 with a board PL3 in a receiver base part AUT3 on the upper sensor module OSM, whereby, in addition to a conventional sensor S3, a power bank can also be connected as a further external energy storage device PB via a Y-cable YK on the downwardly oriented connector SV4. In this way, the upper sensor module OSM can transmit longer with more energy and/or send measurement data at shorter intervals.

In all other respects, the structure of the radio sensor module FSM shown corresponds in particular to the embodiment shown in FIGS. 4A and 4B.

Figure 8:
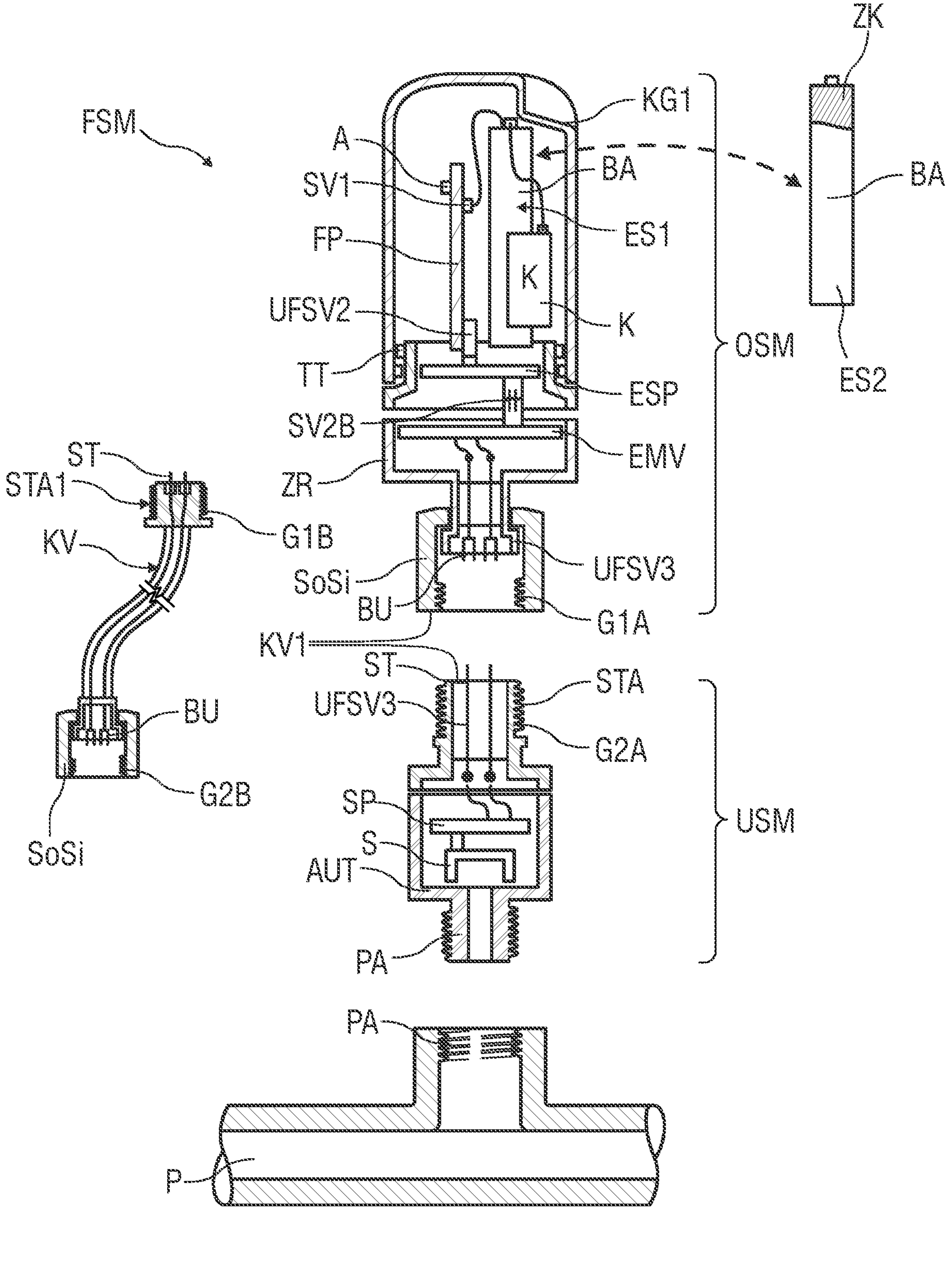

FIG. 8 shows a sectional view of a possible further embodiment of a dismantled radio sensor module FSM according to the invention with a coupling connector KV1 for connecting the upper sensor module OSM and the lower sensor module USM, comprising, among other things, a sensor S and a sensor board SP.

Thereby, in this embodiment, the radio sensor module FSM comprises the universal radio transmission connection UFSV3 at a process P in addition to the coupling connector KV1 as an electrical module coupling section.

For this purpose, the upper sensor module OSM and the lower sensor module USM are connected to each other, in particular via a fixed coupling connector KV1, comprising pin contacts ST on the part of the upper sensor module OSM and socket contacts BU on the part of the lower sensor module USM, the lower sensor module USM being mounted with its process port PA on a process P, so that no further fastening devices are required.

In particular, radio transmission connection UFSV3 is designed in such a way that on the upper sensor module OSM only electrical socket contacts BU are mounted, which are tin-plated, and on the lower sensor module USM, on the other hand, robust and durable pin contacts ST are mounted, which are round in design.

In addition, the coupling connector KV1 has in particular only four, at most five contacts, and is thus built in a very compact way and has a captive retaining ring SOSI with thread G1A, which is designed, for example, as an M12 thread and is mounted on the female connector of the upper sensor module OSM.

The upper thread G1A engages in a thread G2A on the connector section STA of the lower sensor module USM.

Optionally, the upper sensor module OSM and the lower sensor module USM can also be separated at this middle module interface and connected by cable using a coupling connector KV so that the upper sensor module OSM can be placed at a location where improved transmitting and receiving conditions exist. Also, the coupling connector KV has in particular only four, at most five contacts and has a captive retaining ring SOSI with thread G2B, which is formed for example as M12 thread and is designed for fastening to the thread G2A of the connector section STA of the lower sensor module USM. Furthermore, the coupling connector KV has an upper connector section STA1 with a thread G1B, which is formed for fastening to the thread G1A of the upper sensor module OSM.

In particular, a user has the possibility of exchanging an energy storage device ES1 for another energy storage device ES2, in particular for another battery BA, by loosening the housing cap KG1. This energy storage device ES2 can also have an additional capacity ZK and thus a longer design.

Furthermore, the radio board FP and consequently also the radio standard can be exchanged without changing a measuring point, the upper sensor module OSM or the entire radio sensor module FSM including the lower sensor module USM or without decoupling it from the process P.

Figure 9A:
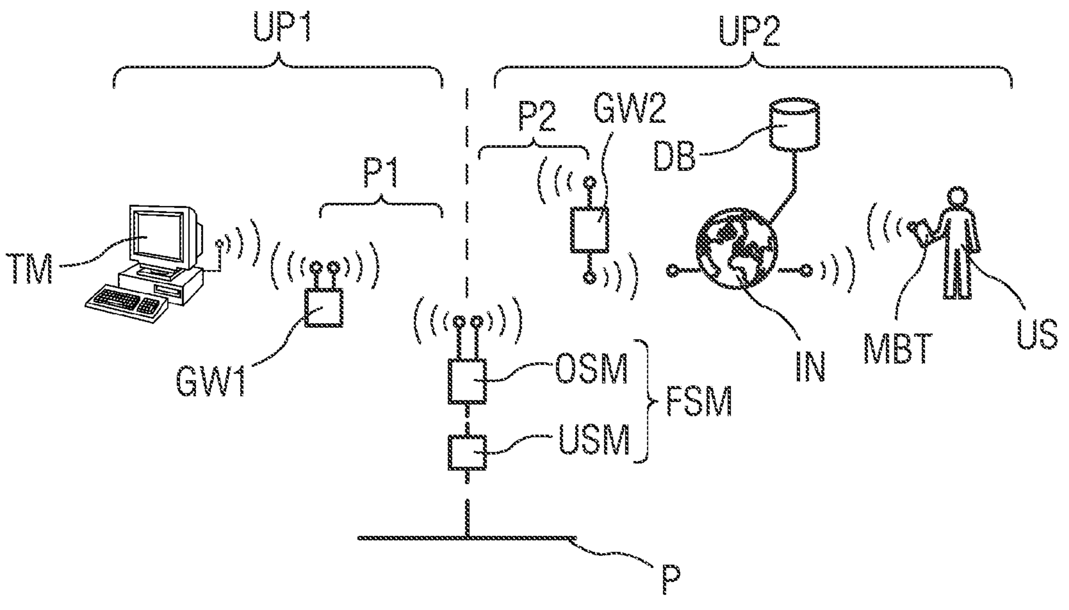

FIG. 9A shows a possible example of a radio sensor module FSM according to the invention in an application environment using two connection protocols P1, P2 for transmitting measured values or for communication.

Here, the upper sensor module OSM is connected via a first connection protocol P1 to a receiving station GW1 for evaluating and displaying measured values on a terminal TM. This forms a communication path UP1. Furthermore, the upper sensor module OSM is connected to a mobile terminal device MBT of a user US via a second connection protocol P2. This forms a further communication path UP2.

The mobile terminal device MBT has a position determination and a voice interface via which the user US can request measured values, for example also via voice and dictation services.

When approaching a radio sensor FS, a message can be output via an available device in this case even if the distance falls below a local space or radius.

For this purpose, communication to the mobile terminal device MBT takes place via the second protocol P2, in particular via a mobile network or the Internet IN or via GSM services, with a second receiving station GW2 and/or a database DB. The first connection protocol P1 can also be implemented, for example, as a so-called Https push service in the form of a so-called JSON file.

Thus, the communication paths UP1, UP2 are formed, over which, in particular over different transmission types, sensor data are sent redundantly to different receivers.

Figure 9B:
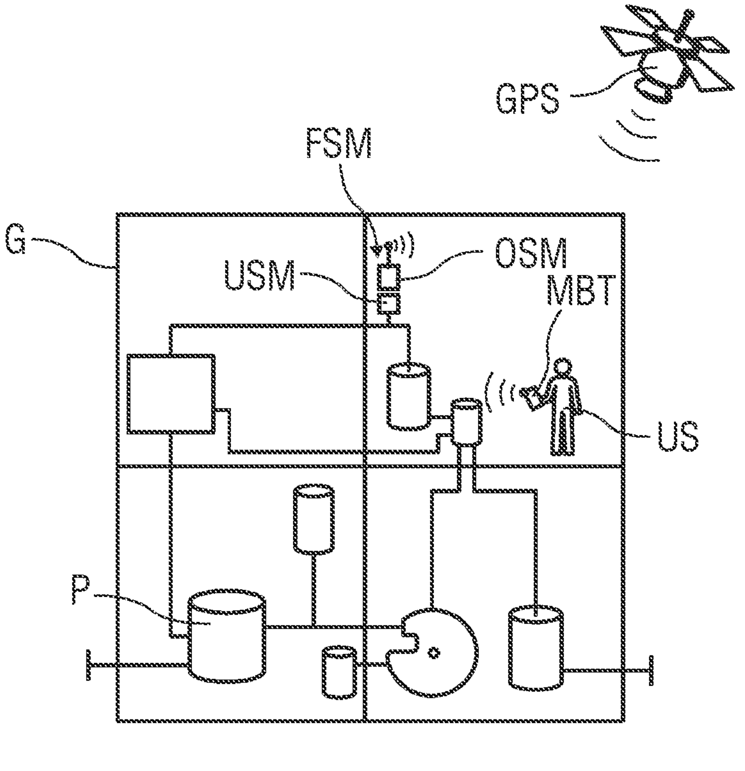

FIG. 9B shows a possible example of a radio sensor module FSM according to the invention in a further application environment in a building G.

Messages and measured values of a radio sensor FS can be triggered here on the one hand by a local approach and/or falling below a distance and on the other hand by threshold values stored in the radio sensor module FSM if these are exceeded during a measurement.

The approach of the mobile terminal device MBT to the radio sensor module FSM can also be implemented in this case by satellite-based position determination GPS, in which case one or more positions of a radio sensor FS or of sensors S are initially determined during a configuration and are determined by the associated mobile terminal device MBT during a configuration and are stored in a database DB for position evaluations for a radio sensor FS or sensor S. In particular, this allows all devices in an available radius to perform a comparison to such a database DB on request, without each radio sensor FS having its own satellite-based positioning GPS.

The invention is not limited to the foregoing detailed embodiments. It may be modified to the extent set forth in the following claims. Likewise, individual aspects from the subclaims may be combined.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A radio sensor module for transmitting measurement data obtained from a measurement of one of pressure, temperature, flow and/or level, the radio sensor module comprising:

a sensor base module with at least one sensor board comprising at least one of a sensor or a connection for connecting to a sensor external to the radio sensor module;

at least one of a process port or an extended sensor port;

a housing section accommodating the sensor base module and the at least one sensor board; and a radio sensor unit having a structure carrier which carries a radio board and an energy storage device therein, the energy storage device supplying the radio board with electrical energy, the energy storage device comprising an electric battery and an electric capacitor which are electrically connected in parallel, wherein the sensor base module forms a lower sensor module, wherein the radio sensor unit forms an upper sensor module, wherein an EMC board is arranged between the radio board and the sensor board, and wherein all electrical connections formed between the lower sensor module and the upper sensor module are routed via the EMC board.

2. The radio sensor module according to claim 1, wherein the battery comprises a lithium cell which operates on a lithium thionyl chloride basis, and wherein the capacitor is formed as a hybrid layer capacitor comprising at least one of electrodes and a cell structure based on lithium intercalation compounds.

3. The radio sensor module according to claim 1, wherein a capacity of the battery is 5 Wh to 15 Wh, and a capacity of the capacitor is 90 Ws to 220 Ws.

4. The radio sensor module according to claim 1, wherein the capacitor is electrically chargeable by the battery.

5. The radio sensor module according to claim 1, wherein:

the energy storage device and the radio board are arranged interleaved with respect to one another in the radio sensor unit, an interlacing angle formed between an axial surface plane of the radio board and an axial surface plane of the energy storage device is greater than zero degrees, so that extensions of the axial surface planes cross outside, the axial surface planes are at least substantially perpendicular to a central axis of the housing section, and/or the energy storage device and the radio board are arranged relative to one another in such a way that their axial surface planes run parallel.

6. The radio sensor module according to claim 1, wherein the energy storage device and the radio board are arranged:

off-center with respect to a central axis of the radio sensor unit, or in a central axis of the radio sensor unit.

7. The radio sensor module according to claim 1, wherein the radio board has an upper section and a lower section, wherein an antenna is mounted on the radio board in the upper section, and wherein a connector coupled to the energy storage device is arranged below the antenna.

8. The radio sensor module according to claim 1, wherein the radio sensor unit comprises a housing cap mechanically coupled to ene of the structure carrier or an intermediate ring arranged between the sensor base module and the radio sensor unit.

9. The radio sensor module according to claim 8, wherein an O-ring is arranged between the housing cap and the structure carrier or is arranged between the housing cap and the intermediate ring.

10. The radio sensor module according to claim 8, wherein the housing cap and the structure carrier or the housing cap and the intermediate ring have locking elements for forming a bayonet lock.

11. The radio sensor module according to claim 8, wherein the housing cap has at least one of an inner stop and an inner step, and the energy storage device is axially fixed by at least one of the stop or the step, or wherein the energy storage device is fixed or mounted in a vibration-damped manner by at least one spring element.

12. The radio sensor module according to claim 8, wherein the housing cap is formed from plastic, wherein the housing section accommodating the sensor base module and the sensor board is formed from stainless steel, and wherein the housing cap and the housing section are connected to one another via one of the structure carrier or the intermediate ring.

13. The radio sensor module according to claim 1, wherein the structure carrier has integrally formed receptacles for the energy storage device and the radio board, and wherein the receptacles are each formed as a guide section that:

encloses the energy storage device and the radio board in sections, and support the energy storage device and the radio board in U-shaped sections or support the energy storage device and the radio board in circular sections.

14. The radio sensor module according to claim 1, wherein a metal-oxide-semiconductor field-effect transistor or a microcontroller is provided, which are each designed to activate the sensor base module, wherein, in an activated state, the sensor base module processes at least one measured value detected by the sensor, and wherein the metal-oxide semiconductor field-effect transistor or the microcontroller is designed to deactivate the sensor base module after processing the measured value, in particular after a time of 50 ms to 500 ms.

15. The radio sensor module according to claim 14, wherein the metal-oxide-semiconductor field-effect transistor or the microcontroller is designed to keep the sensor base module with at least one of the sensor or the connection for connecting to the sensor external to the radio sensor module in a standby mode, the sensor base module and the at least one corresponding sensor have a current consumption of less than 1 ρA in the stand-by mode, and the metal-oxide-semiconductor field effect transistor or the micro-controller activates the sensor base module with at least one of the sensor or the connection for connecting to the sensor external to the radio sensor module via an interrupt from the stand-by mode when a measured value is requested.

16. The radio sensor module according to claim 1, wherein the sensor is a piezo sensor, a thick film ceramic sensor, a thin film sensor, a thermal flow sensor, or an optical level sensor.

17. The radio sensor module according to claim 1, wherein the radio board comprises transmission units for data transmission with at least two different radio standards, and wherein:

the radio standards comprise at least one of Bluetooth or Radio HART or a proprietary transmission method based on a chirp spread spectrum modulation technique, or the radio board comprises at least one antenna designed as a chip antenna.

18. The radio sensor module according to claim 1, wherein the radio sensor unit comprises at least one communication interface, and wherein the communication interface is designed for data transmission with at least one of the sensor or the sensor external to the radio sensor module.

19. The radio sensor module according to claim 1, wherein the process port is designed to mechanically position and hold the radio sensor module at a complementary connection alone.

20. The radio sensor module according to claim 1, comprising a detector adapted to detect a local approach of a mobile terminal device to a radio sensor via location data previously stored in a database by matching an actual position of the mobile terminal device with the location data of the database.

21. The radio sensor module according to claim 1, wherein all or a substantial portion of the electrical connections between the sensor board, the radio board and the EMC board are made via plug connectors fixed to printed circuit boards of the sensor board, the radio board and the EMC board, and wherein the EMC board forms a sealing section between the radio sensor unit and the sensor base module.

22. The radio sensor module according to claim 21, wherein the plug connectors are formed in at least one at least six-pole connection plug, and wherein a UART protocol or a $I^2C$ protocol is provided as an internal data protocol.

23. The radio sensor module according to claim 1, wherein the EMC board is connected in a sealed manner to a part of a housing of the lower sensor module, the structure carrier, or an intermediate ring, or wherein the EMC board is guided in a sealed manner in the housing, the structure carrier, or the intermediate ring.

24. The radio sensor module according to claim 1, wherein the EMC board is coupled to an electrical module coupling section of the radio sensor unit, or wherein the EMC board is coupled to the sensor board by a plug-in connection.

25. A radio sensor module for transmitting measurement data obtained from a measurement of one of pressure, temperature, flow and/or level, the radio sensor module comprising:

a sensor base module with at least one sensor board comprising at least one of a sensor or a connection for connecting to a sensor external to the radio sensor module;

at least one of a process port or an extended sensor port;

a housing section accommodating the sensor base module and the at least one sensor board; and a radio sensor unit having a structure carrier which carries a radio board and an energy storage device therein, the energy storage device supplying the radio board with electrical energy, the energy storage device comprising an electric battery and an electric capacitor which are electrically connected in parallel, wherein the radio sensor unit comprises an electrical module coupling section with electrical contacts, wherein the sensor base module comprises an electrical module coupling section with electrical contacts, and wherein a coupling direction of the electrical contacts of the electrical module coupling sections of the radio sensor unit and the sensor base module is directionally the same as a mounting direction of the radio board and the energy storage device of the radio sensor unit.

26. The radio sensor module according to claim 25, wherein an opening of one of the process port and the extended sensor port is directionally the same as the coupling direction of the electrical module coupling sections.

27. The radio sensor module according to claim 25, wherein at least one of the electrical module coupling sections has a captive retaining ring attached to the radio sensor unit, wherein both of the electrical module coupling sections have complementary locking elements for forming a bayonet lock for joint connection, or wherein both of the electrical module coupling sections have complementary threads or M12 threads for forming a bayonet lock for common connection.

28. The radio sensor module according to claim 25, wherein the electrical contacts of one of the electrical module coupling sections are formed as socket contacts, and wherein the electrical contacts of the other electrical module coupling section are designed as pin contacts complementary to the socket contacts.

29. A modular system for forming a radio sensor module for transmitting measuring data obtained from a measurement of one of pressure, temperature, flow and/or level, the modular system comprising:

a sensor base module with at least one sensor board comprising at least one sensor or a connection for connecting to a sensor external to the radio sensor module;

at least one process port or extended sensor port;

a housing section accommodating the sensor base module and the sensor board;

at least two different radio boards of different dimensions;

at least two energy storage devices with different dimensions that are provided for electrical supply of the radio boards, each energy storage device comprising an electric battery and an electric capacitor, which are electrically connected in parallel;

at least one radio sensor unit having a structure carrier that is designed to accommodate the radio boards of different dimensions and the energy storage devices of different dimensions, and the at least one radio sensor unit comprising fastening structures that are designed for damage-free mounting and dismounting of the radio board and the energy storage devices; and housing caps of different sizes, which are each mechanically coupled to a respective structure carrier, wherein respective lengths of the housing caps, starting from a coupling structure for coupling to the structure carrier to an opposite end, correspond to the different dimensions of the energy storage devices or the different dimensions of the radio boards.

* * * * *